United States Patent
Schoenborn et al.

(10) Patent No.: US 9,196,384 B2
(45) Date of Patent: Nov. 24, 2015

(54) MEMORY SUBSYSTEM PERFORMANCE BASED ON IN-SYSTEM WEAK BIT DETECTION

(71) Applicants: Theodore Z. Schoenborn, Portland, OR (US); Christopher P. Mozak, Beaverton, OR (US)

(72) Inventors: Theodore Z. Schoenborn, Portland, OR (US); Christopher P. Mozak, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 13/730,429

(22) Filed: Dec. 28, 2012

(65) Prior Publication Data

US 2014/0189433 A1    Jul. 3, 2014

(51) Int. Cl.
  *G06F 11/00* (2006.01)
  *G11C 29/50* (2006.01)
  *G11C 29/06* (2006.01)

(52) U.S. Cl.
  CPC ............. *G11C 29/50* (2013.01); *G11C 29/06* (2013.01); *G11C 2029/5002* (2013.01)

(58) Field of Classification Search
  CPC ............................................ G06F 11/07
  USPC .................... 714/42, 47.1, 47.2, 54, 718
  See application file for complete search history.

(56) References Cited

U.S. PATENT DOCUMENTS

| | | | |
|---|---|---|---|
| 4,491,930 A | 1/1985 | Hyatt | |
| 6,522,174 B2 | 2/2003 | Martin et al. | |
| 6,774,678 B2 | 8/2004 | Martin et al. | |
| 6,825,693 B2 | 11/2004 | Schoenborn et al. | |
| 6,847,617 B2 | 1/2005 | Borkar et al. | |
| 6,894,536 B2 | 5/2005 | Martin et al. | |
| 7,155,006 B2 | 12/2006 | Casper et al. | |
| 7,206,981 B2 | 4/2007 | Schoenborn et al. | |
| 7,209,907 B2 | 4/2007 | Cherukuri et al. | |
| 7,272,707 B2 | 9/2007 | Liu et al. | |
| 7,324,458 B2 | 1/2008 | Schoenborn et al. | |
| 7,328,359 B2 | 2/2008 | Fordsham et al. | |
| 7,444,558 B2 | 10/2008 | Mitbander et al. | |
| 7,464,307 B2 | 12/2008 | Nejedlo et al. | |
| 7,617,424 B2 | 11/2009 | Frodsham et al. | |
| 7,624,225 B2 | 11/2009 | Gower et al. | |
| 7,627,730 B1 | 12/2009 | Moll | |
| 7,647,467 B1 | 1/2010 | Hutsell et al. | |
| 7,711,878 B2 | 5/2010 | Cherukuri et al. | |
| 7,804,890 B2 | 9/2010 | Navada et al. | |

(Continued)

OTHER PUBLICATIONS

Corrigan, Steve, "Skew Definition and Jitter Analysis", *Published Feb. 2000, Analog Applications Journal*, <http:www.ti.com/lit/an/slyt179.pdf>.

(Continued)

*Primary Examiner* — Dieu-Minh Le
(74) *Attorney, Agent, or Firm* — Blakely, Sokoloff, Taylor & Zafman LLP

(57) ABSTRACT

A memory subsystem can test a memory device in situ, testing the performance of parameters of operation the device in the system it is built into during production. Thus, the system can detect the specific values that will work for one or more operating parameters for the memory device in actual runtime. A test component embedded in the memory subsystem can perform a stress test and identify specific bits or lines of memory that experience failure under one or more stresses. The system can then map out the failed bits or lines to prevent the bits/lines from being used in runtime of the system.

29 Claims, 8 Drawing Sheets

(56) References Cited

U.S. PATENT DOCUMENTS

| | | |
|---|---|---|
| 7,844,767 B2 | 11/2010 | Cherukuri et al. |
| 7,886,174 B2 | 2/2011 | Spry et al. |
| 7,936,684 B2 | 5/2011 | Schoenborn et al. |
| 7,979,039 B2 | 7/2011 | Sumesaglam et al. |
| 8,045,663 B2 | 10/2011 | Bae et al. |
| 8,195,996 B2 | 6/2012 | Fordsham et al. |
| 8,331,176 B2 | 12/2012 | Mozak et al. |
| 8,335,894 B1 | 12/2012 | Rajan et al. |
| 8,819,474 B2 | 8/2014 | Schoenborn et al. |
| 8,868,992 B2 | 10/2014 | Spry et al. |
| 8,996,934 B2 | 3/2015 | Mozak et al. |
| 9,003,246 B2 | 4/2015 | Mozak et al. |
| 9,009,531 B2 | 4/2015 | Mozak et al. |
| 9,009,540 B2 | 4/2015 | Mozak et al. |
| 2005/0262184 A1 | 11/2005 | Cherukuri et al. |
| 2007/0088520 A1* | 4/2007 | Hagerott et al. .............. 702/108 |
| 2008/0130811 A1 | 6/2008 | Bae et al. |
| 2008/0235444 A1 | 9/2008 | Gower et al. |
| 2011/0022870 A1 | 1/2011 | McGrane et al. |
| 2011/0141827 A1 | 6/2011 | Mozak et al. |
| 2012/0243364 A1 | 9/2012 | Hacking et al. |
| 2013/0058145 A1 | 3/2013 | Yu et al. |
| 2013/0173970 A1* | 7/2013 | Kleveland et al. ............ 714/710 |
| 2013/0313709 A1 | 11/2013 | Hinck et al. |
| 2013/0346721 A1 | 12/2013 | Giovannini et al. |
| 2014/0157065 A1* | 6/2014 | Ong .............................. 714/718 |
| 2014/0184523 A1 | 7/2014 | McCall et al. |
| 2014/0189293 A1 | 7/2014 | Gopal et al. |
| 2014/0266320 A1 | 9/2014 | Conrow et al. |

OTHER PUBLICATIONS

Kin, Kenrick, et al., "Determining The Benefits Of Direct-Touch, Bimanual, and Multifinger Input on A Multitouch Workstation", *Proceedings of Graphics Interface 2009, Canidian Information Processing Society 2009*.

\* cited by examiner

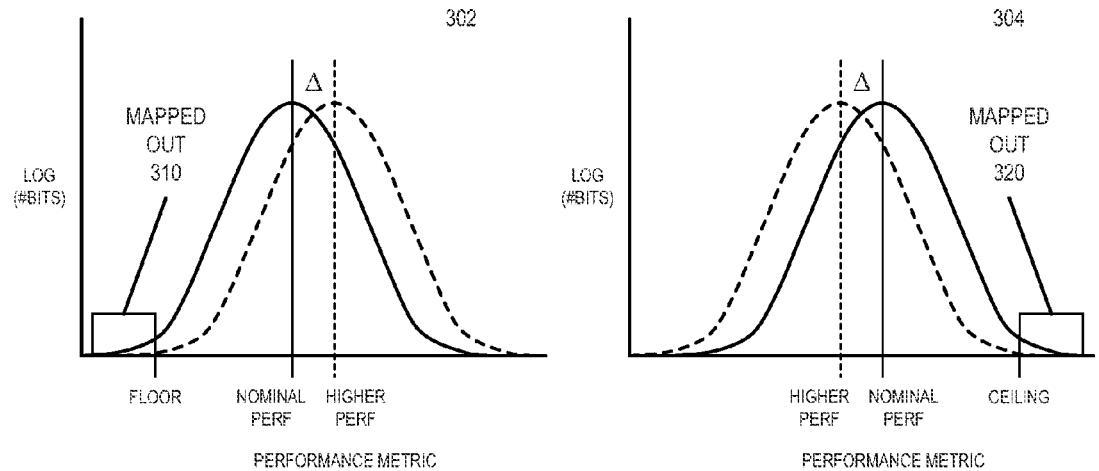
FIG. 3A
FIG. 3B
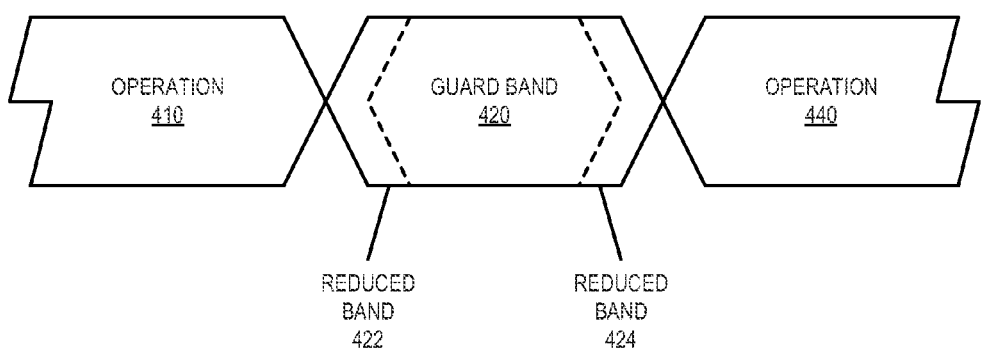
FIG. 4

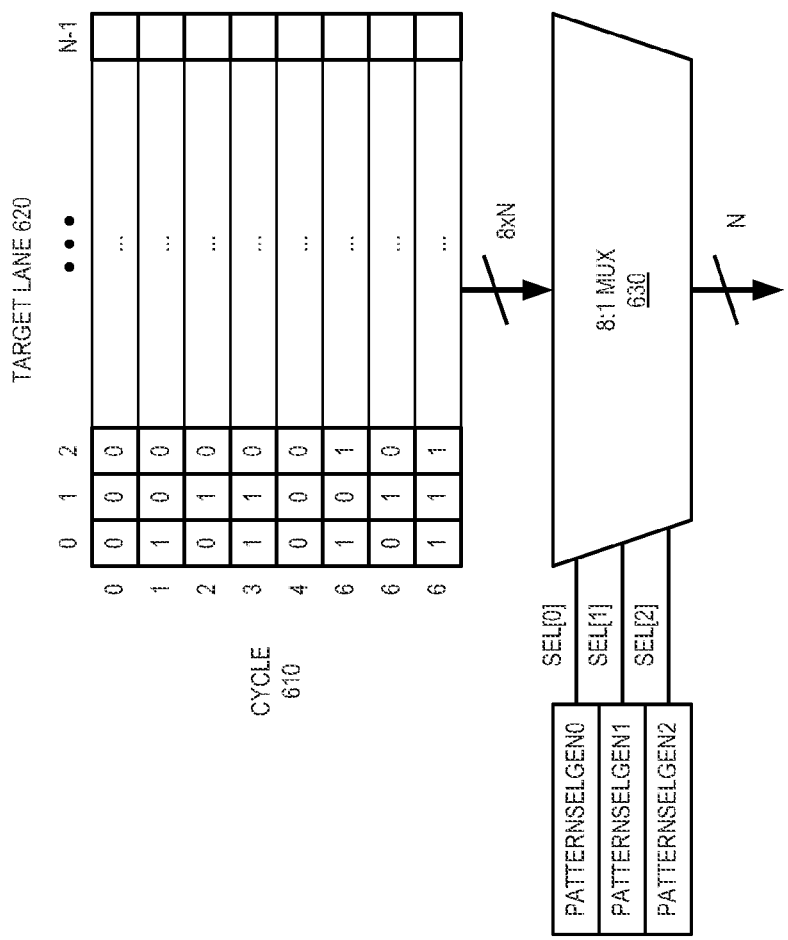
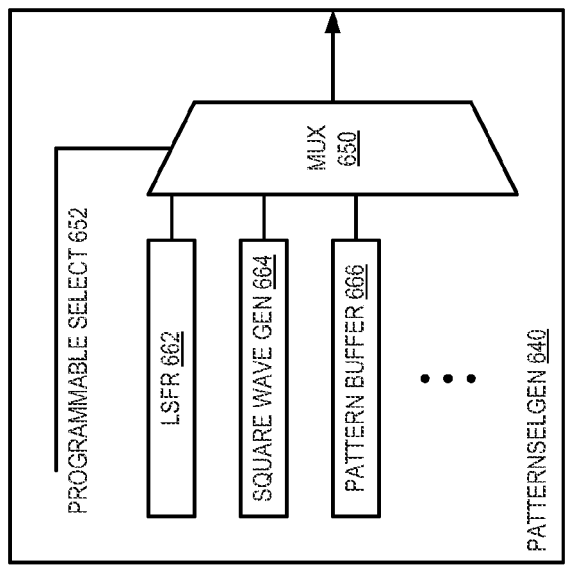
FIG. 6A
FIG. 6B

MEMORY SUBSYSTEM PERFORMANCE BASED ON IN-SYSTEM WEAK BIT DETECTION

FIELD

Embodiments of the invention are generally related to memory subsystems, and more particularly to operating a specific system at higher performance based on in-system testing and weak bit detection.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

BACKGROUND

Memory devices find ubiquitous use in electronic devices, such as in consumer electronics. Memory devices are typically used to store executable code and data for the runtime operation of the electronic device. Many electronic devices stay operating almost continuously for long periods of time, potentially transferring large amounts of data in and out of the memory devices. Thus, memory devices are tested to determine if they will perform according to design expectations to handle the stresses of runtime operation.

The design expectations are set to minimum or standard performance levels based on expected system yields across all systems. Some memory devices may be capable of operating at higher performance, but are only set to operate in accordance with minimum design expectations. The memory devices are traditionally tested prior to being placed in production-level systems, but such testing only identifies whether or not the memory devices meet the minimum or standard design expectations.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIGS. 3A-3B are graphical diagrams of embodiments of performance metric versus number of bits that meet performance expectations, including an indication of bits to map out.

FIG. 4 is a block diagram of an embodiment of an operation or command sequence, including an indication of a reduction of guard band to operate a system at higher performance.

FIG. 6A is a block diagram of an embodiment of a test signal generator including a bit array selectable by pattern generators.

FIG. 6B is a block diagram of an embodiment of programmable pattern selection generator.

Figure 1:
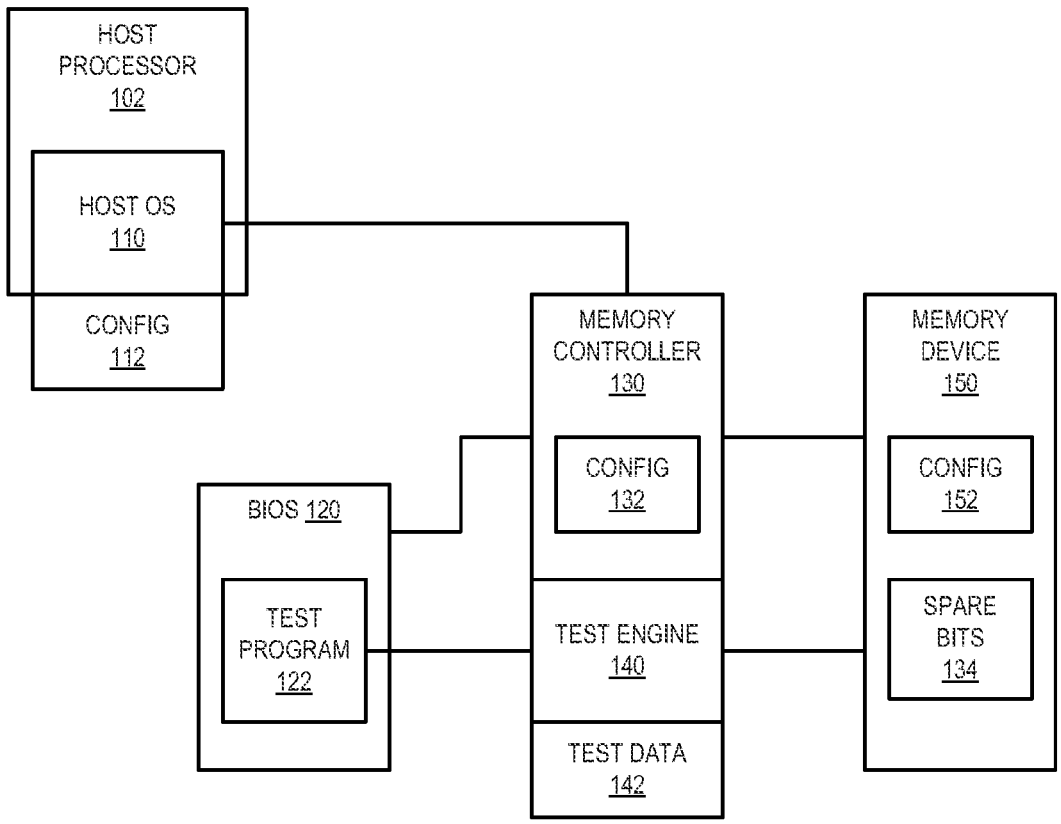
FIG. 1 is a block diagram of an embodiment of a system having a test engine that provides testing in-system.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem can test performance of a memory device in the system it is built into (e.g., consumer device) for runtime operation. A test system can test performance of the memory subsystem based on one or more operating parameters of the device. A test component embedded in the memory subsystem can perform a stress test and identify specific bits or lines of memory that experience failure under one or more stresses. The system can then map out the failed bits or lines to prevent the bits/lines from being used in runtime of the system. Thus, the system can detect specific bits to remove from runtime operation, which will allow operating the system at higher performance with respect to the one or more operating parameters.

Performance characteristics of an electronic system can be categorized as power consumption, performance/latency, and reliability. While some system changes can affect multiple categories, a change that can positively affect one without causing degradation of the others is considered a desirable change. As described herein, the test system can identify and map out weak bits, which can result in a positive change in one area without requiring a cost in one of the other areas.

Modern electronic systems use many different low power modes. However, systems that use volatile memory devices (devices whose state is indeterminate if power is interrupted to the device) require the use of power even in low power modes. Additionally, the voltages of the memory devices in active modes also significantly affect power consumption. Memory device high voltage reference or voltage supply (VDD) is typically set to a value determined by the manufacturer of the memory device. The determined value of VDD represents a standard or specification for VDD. Mapping out weak bits can allow a specific system to operate at a lower memory device VDD without affecting other performance characteristics.

An electronic system's performance is typically evaluated as a function of latency of particular operations. Memory device latency affects the ability of a processor to perform operations and generate throughput. Currently, all parameters that affect memory device internal latency are currently determined by memory device manufacturers to ensure functionality at a particular data protection management (DPM) level. The latency values are not changed. The determined latency values represent a standard or specification for latency. Mapping out weak bits can allow a specific system to operate at a lower latency without affecting other performance characteristics.

Reliability of an electronic device can be identified by a Failure Interval Time (FIT) rate. Of particular concern herein is the FIT rate for memory devices incorporated into the devices. Currently, the memory device FIT rate is assumed to be close to zero, when in reality it is a variable number depending on the level of manufacturing test coverage applied to the shipped memory modules, combined with additional coverage built in with existing reliability features (e.g., ECC (error correction coding), sparing, other features). Mapping out weak bits can allow a specific system to operate at a FIT rate closer to zero than what generally achievable.

Memory cell reliability can be pictured as a bell curve (see FIG. 2), with most cells operating at close to the same level, and some outlying cells being "weaker" than the others. As used herein, a weak bit or a weak cell is one whose performance is worse than and falls outside the mean of the other bits or cells in the memory device. The performance of the memory device is frequently based on the performance of the weakest bits. The following disclosure generally only refers to "bits" for simplicity in description, which will be understood to refer to bits, cells, lines, pages, or other portion of the memory device that is detected to be weak or produce an error, and is to be mapped out.

As described herein, testing can specifically identify weak bits in a memory device, and map the weak bits out. Mapping out the weak bits involves one or more techniques used to disallow those bits from being used during runtime operation of the memory device, as described in more detail below.

Thus, improved performance in at least one performance characteristic is achievable. The testing can identify a specifically lower VDD operating point by empirically testing and identifying weak bits to map out. For memory device VDD adjustment, a test system can iteratively adjust the memory device VDD to lower values and test for weak bits. The test system monitors performance of the system until a threshold number of weak bits is identified and mapped out, which allows use of a lower memory device VDD in runtime operation.

The testing can identify a lower internal latency supported by a specific system by empirically testing and identifying weak bits to map out. For latency parameter adjustment, a test system can iteratively adjust one or more internal latency parameters to lower values and test for weak bits. The test system monitors performance of the system until a threshold number of weak bits is identified and mapped out, which allows use of lower internal latency operating points in runtime operation.

The testing can lower memory device FIT rates by empirically testing and identifying weak bits to map out. A test system performs one or more stress tests on the memory device to accelerate failures and identify a threshold number of weak bits, which are mapped out. Mapping out the weak bits achieves a lower FIT rate for a system in runtime operation. A lower FIT rate can also enable use of a measurably lower ECC correction rate.

The testing provides stress on the memory device from the perspective of one or more performance parameters of interest, as provided by the examples above. It will be understood that other performance parameters could be evaluated by a test system. From one perspective, the memory device and memory subsystem are specifically tested in-system to determine whether the subsystem can be operated beyond the specification or standard applicable to the memory subsystem and memory device. The memory devices and subsystems described herein are presumed to pass specification, and as such comply with a standard or a specification that applies to the memory device with respect to timing parameters, error rate, and other operating parameters. Thus, based on what is described herein, a commodity device can be made to operate at a higher performance than the performance for which it is rated. The testing can be performed based only on the system itself, without the need for outside test equipment.

Regarding the testing, a test system as referred to herein includes hardware elements located in and/or near the memory controller (e.g., on a shared die space, on a SoC (system on a chip)). The test system can create precise combinations of I/O (input/output) that result in I/O-induced power supply noise, inter-symbol interference (ISI), signal crosstalk, and/or other conditions. Any of these effects can be created by precisely controlling the data on each I/O lane, the pattern on each command lane, and/or how the data signals align with each other across lanes. Additionally, the test system can monitor the performance of the memory devices when refresh rates or other operating parameters of the system are adjusted.

In one embodiment, the test system is configured to create any of a variety of test pattern signal conditions, which enables the test system to create the desired effects to test the memory subsystem. Such pattern signal conditions can include: pseudo random patterns on all lanes, walking one patterns, walking zero patterns, row stripes, column strips, checkerboards, and/or others; applying one pattern to a victim lane while adjacent aggressor lanes get a different pattern, which can further include rotating the victim lane; driving a single frequency tone pattern to excite resonances; combinations of resonance patterns and pseudo random patterns to simultaneously create supply noise and ISI/crosstalk; fixed-pattern hardware training modes (e.g., providing a fixed 1010 pattern for read training), and/or others. In one embodiment, the test system can generate a fixed pattern that allows software to control the values on every lane (e.g., data lane or command lane) in every cycle independently to find a worst case pattern via advanced search techniques. In addition to the ability to generate each of the pattern conditions mentioned, the test system sits close to the memory controller scheduler, which enables the test system to generate all of the pattern types at high speed in hardware.

In one embodiment, a test engine is located prior to the memory controller in the data/request path to test data and commands by injecting memory access transactions into the memory controller. In one embodiment, a test engine or part of a test engine is part of the memory controller itself, and sits prior to the scheduler. Thus, the test system can provide data to be scheduled by the scheduler of the memory controller. As a result, any test traffic is sent to the memory device in a way compliant with memory device access protocol. Thus, errors in the reading back should indicate actual errors in the memory subsystem.

In one embodiment, the test system generation is performed by leveraging a write data buffer or comparable structure on or near the memory controller. Description herein is made in reference to a write data buffer, but such descriptions will be understood to apply equally to a comparable array structure where rows and columns of bits can be selected to generate patterns as described herein. In one embodiment, the write data buffer or comparable structure acts as a lookup table to generate Boolean functions of the select lines of the array. In one embodiment, the pattern generation includes incrementing through lines of the buffer array to allow for multiple stress patterns. In one embodiment, the test system includes logic to save and/or restore state from a pattern selection generator (PatternSelGen).

In general, memory access transactions referred to herein indicate to the memory controller what to do, but not how to do it. The memory controller controls tracking the current state of memory and how to access a location based on the current state of memory. Thus, the memory controller determines how to Activate and/or Precharge the proper pages, issue appropriate CAS/RAS commands, obey all relevant timing related to accessing the memory device, and otherwise comply with memory device access protocols.

The test engine as described herein can be used to test memory devices. Any memory subsystem that uses a memory controller with a scheduler or equivalent logic can implement at least one embodiment of the test engine. Reference made herein to memory devices can include different memory types. For example, memory subsystems commonly use DRAM, which is one example of a memory device as described herein. Thus, the test engine described herein is compatible with any of a number of memory technologies, such as DDR4 (dual data rate version 4, specification in development as of the filing of this application), LPDDR4 (low power dual data rate version 4, specification in development as of the filing of this application), WIDEIO (specification in development as of the filing of this application), and others.

FIG. 1 is a block diagram of an embodiment of a system having a test engine that provides testing in-system. System 100 includes a memory subsystem including memory controller 130 and memory device 150. System 100 represents a production system, or a system in which memory device 150 is placed to be used by a consumer. System 100 includes a hardware platform (not explicitly shown) on which host processor 102 resides, as well as the memory subsystem including memory controller 130 and memory device 150. BIOS (basic input/output system) 120 also resides on the hardware platform.

Host processor 102 executes, among other things, host operating system (OS) 110. Host OS 110 generally provides operational control of system 100 during runtime. Host OS 110 provides software to hardware and hardware to software interfaces to allow a user to interact with system 100. BIOS 120 provides start-up control over system 100 until host OS 110 is loaded.

Host OS 110 provides memory access requests to memory controller 130 for access to memory device 150 for read and/or write of data. Similarly, BIOS 120 can provide memory access requests to memory controller 130. Memory controller 130 accesses memory device 150 in response to data access requests. In one embodiment, test engine 140 generates data access requests and/or access transactions for memory controller 130 to send to memory device 150. In one embodiment, test engine 140 can directly provide test data to memory device 150.

In one embodiment, BIOS 120 initiates a test via test program 122, and accesses test engine 140 to generate test data 142 to test memory device 150, either directly or via memory controller 130. In one embodiment, test data 142 represents data stored during monitoring of testing memory device 150, such as data that is used to identify weak bits (or lines, pages, or other portion) of memory device 150. In response to identifying weak portions of memory device 150, system 100 can map out the weak bits. Mapping out weak portions of memory device 150 can be performed at different granularities. For example, at memory controller 130 or at memory device 150, the granularity can be: cacheline, column or row, page, and/or rank. At host OS 110, the granularity can be an address or address range.

There are a number of different ways bits of memory can be mapped out. Configuration 152 represents a mechanism within memory device 150 that can be used to disallow the use of certain bits. In one embodiment, the bits can be remapped to spare bits 134. In one embodiment, the bits are simply not used, and no remapping is done. In one embodiment, configuration 132 represents a mechanism at memory controller 130 to map out weak bits. For example, memory device 150 can leave the bits unaffected, but memory controller 130 will not write to or otherwise use the bits. Thus, configuration 132 can represent information used by a scheduler of memory controller 130 to schedule access to memory device 150. In one embodiment, the bits are mapped out at the level of host OS 110. Configuration 112 represents a mechanism that host OS 110 uses to avoid access to specific bits of memory device 150. The mechanisms at host OS 110 and memory controller 130 can include, for example, tables or logs of restricted addresses. Other implementations may use reserved locations and/or alternative memory storage to remap a region of memory with weak bits to a known good location. For example, a request to weak region A can be automatically rerouted to region B. In one embodiment, mapping out weak bits includes marking the specific bits as invalid, resulting in a reduction of the memory space available.

As described above, the testing can specifically involve adjusting one or more performance parameters of interest to test for weak bits at different operating parameters. In one embodiment, a parameter value is selected that is one step or iteration up from a tested operating parameter at which the test system detects a threshold number of failures. In one embodiment, the selected parameter value is the last parameter value tested. The threshold can be a total number of bits or lines that can be remapped. Alternatively, the threshold can be a total number of bits that can be removed from the specific system, e.g., evaluating a tradeoff between memory capacity and system performance, such determining that a 0.1% reduction in memory capacity can be sacrificed for a percentage increase in performance, or some other evaluation or determination.

The test system can determine that a bit is a weak bit if, for example, the bit fails to return a value written to it, or if the timing of the response is incorrect. A bit is a weak bit if it typically operates correctly, but begins to show errors in response to stress testing. Most of the bits will continue to operate correctly, even under the stress of operating beyond a specification. Those bits that produce errors or failures in response to the stress can be specifically identified and mapped out. After mapping out the weak bits, the system can operate at a lower refresh rate.

It will be understood that the same tests as currently known for testing memory devices can be used to test the memory devices in-system, in terms of content of the test. The difference is that the test is performed by an embedded test system, which results in certain bits or address lines of the memory device being mapped out (and potentially remapped). Thus, a memory device and memory subsystem can be tested at a performance level higher than a minimum rating guaranteed for the memory device.

Figure 2:
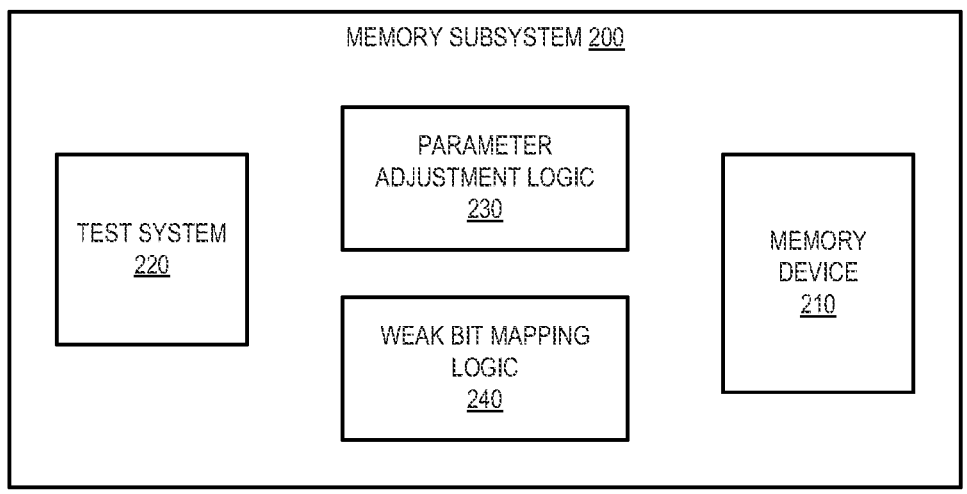
FIG. 2 is a block diagram of an embodiment of a memory subsystem having a test system that provides testing in-system.

FIG. 2 is a block diagram of an embodiment of a memory subsystem having a test system that provides testing in-system. Memory subsystem 200 provides one example embodiment of a memory subsystem in accordance with system 100. Elements of memory subsystem 200 can include memory device 210, test system 220, parameter adjustment logic 230, and weak bit mapping logic 240.

Memory device 210 represents one or more devices in the memory subsystem. Test system 220 provides testing of memory device 210 to detect weak bits in memory device 210. Parameter adjustment logic 230 represents logic to change a performance parameter. In one embodiment, logic 230 represents logic that adjusts a VDD to memory device 210. Such logic can include a variable voltage regulator circuit that can provide a variable voltage to the memory device in response to control logic such as changing the Voltage ID (or VID) code. In one embodiment, logic 230 represents logic that adjusts one or more latency parameters. For example, logic 230 could adjust latency parameters related to delays (or guard bands) between an Activate command and a column address strobe/signal (CAS), between a Precharge command and an Activate command, between an Activate command and a Read or Write command, between a Read command and data availability, between a Read command and a Precharge command, and/or others. In one embodiment, logic 230 represents logic that adjusts one or more parameters related to reliability. For example, logic 230 could adjust parameters related to any of the latency parameters above or other timing parameters refresh rate, self-refresh rate, VDD, and/or temperature.

In one embodiment, parameter adjustment logic 230 is part of a memory controller, and affects configuration settings within the memory controller that control the delays. In one embodiment, logic 230 exists outside the memory controller, such as in a test engine close to the memory controller. In one embodiment, logic 230 causes the memory controller to adjust settings in the memory device itself, such as by setting configuration options. Test system 220 detects weak bits that produce errors or failures in response to the adjustment to any of the operating parameters above.

Weak bit mapping logic 240 enables memory subsystem 200 to map out detected weak bits. In one embodiment, logic 240 is part of test system 220. In one embodiment, logic 240 is part of the memory controller. In one embodiment, some of logic 240 is within the memory device itself. In one embodiment, some of logic 240 is within an operating system or a BIOS of the system. Logic 240 can also be distributed in a combination of the memory controller, test system, memory device, or operating system. In one embodiment, logic 240 maps out weak bits within the memory controller, with a granularity of cacheline, column, row, page, and/or rank. In one embodiment, logic 240 maps out weak bits in the memory device, with a cacheline, column, row, page, and/or rank.

As mentioned above, typically a system is designed to account for only one of reliability, performance, or power. Thus, an administrator, designer, manufacturer, or other individual can determine which consideration is the most significant for a given system deployment and run test operations to improve that particular characteristic. In one embodiment, one can choose to address multiple of the characteristics, which would need to include certain heuristics and/or search algorithms in the test system to determine which operating parameters to change.

FIGS. 3A-3B are graphical diagrams of embodiments of performance metric versus number of bits that meet performance expectations, including an indication of bits to map out. Graph 302 illustrates an embodiment where a higher metric value corresponds to higher system performance. Graph 304 illustrates an embodiment where a lower metric value corresponds to higher system performance. Thus, in graph 302, mapped out bits 310 are at the bottom of the graph, closest to the intersection of the performance metric axis with the number of bits axis. In Graph 304, mapped out bits 320 are at the top end of the curve, along the performance metric axis furthest from the number of bits axis. It will be understood that the graphs are intended to be illustrated very generically, and the distribution curve will likely have a different shape for each different metric, and different than what is shown generically in the figures.

In each of graphs 302 and 304, the solid line curve represents the graph of nominal performance, or the expected performance distribution of a commodity component. Thus, for a system that is manufactured with the specific system components, the solid line graph is reflective of the expected performance of the system. However, once bits 310 are mapped out from a system represented by graph 302, or bits 320 are mapped out of a system represented by graph 304, a system administrator can select how to apply the benefits of mapping out the bits.

In one embodiment, the administrator can simply choose to operate the system at the nominal performance level, which will result in fewer errors. Such a choice would most benefit the FIT rate for a system. In one embodiment, the administrator can choose to operate the system at a higher performance level (either higher metric value for graph 302, or lower metric value for graph 304), some delta of improvement over the nominal performance level. Such a choice can be thought of as effectively shifting the entire distribution graph (up for graph 302, or down for graph 304), while maintaining with a similar FIT rate. The shifted graphs are shown in dashed lines. It will be understood that the graphs are not necessarily to scale.

Thus, a test system can detect outlying bits 310 and/or 320 and map out such bits in accordance with any embodiment described herein. The system can then operate at higher performance settings with a similar error rate, or can be operated at the same performance settings with a lower error rate. The increased performance can be considered to operate the device beyond the specification, which can decrease power usage, and potentially increase the bandwidth of the system.

A memory device can include spare bits, which the memory device can use to remap weak bits. The test system can detect and specifically identify weak bits that cannot operate at a lower frequency refresh rate or operate at a tighter performance parameter. In one embodiment, the test system indicates the weak bits to the memory device, which can then remap the bits. In one embodiment, the test system indicates the bits to the memory controller, which in turn writes a configuration setting to one or more registers of the memory device to cause the memory device to use the spare bits instead of the weak bits. DRAM devices in particular typically have spare cells, and the memory device can fuse out one line and map in the spare.

In one embodiment, the total number of mapped out bits 310 or 320 is equal to a total number of bits that can be remapped to spare bits in the memory device. Thus, for example, the test system can detect weak bits, and remap them starting at the weakest bit. The weakest bits are identified as the first to fail under the least amount of stress. Thus, for example, the bits that fail at the lowest performance level (lower end of graph 302, or higher end of graph 304). In one embodiment, the test system monitors for failures until a threshold number of weak bits has been detected.

FIG. 4 is a block diagram of an embodiment of an operation or command sequence, including an indication of a reduction of guard band to operate a system at higher performance. Operations 410 and 440 represent any commands or data access operations that should be separated by a delay or guard band 420. Guard band 420 represents any internal delay parameter that should exist between two operations. Examples of delays between operations include, but are not limited to time between an Activate command and a column address strobe/signal (CAS), between a Precharge command and an Activate command, between an Activate command and a Read or Write command, between a Read command and data availability, between a Read command and a Precharge command, and/or others.

In one embodiment, guard band 420 can be reduced in response to mapping out weak bits. Reduced band 422 represents a reduction of the guard band on the front-end, such as by initializing a guard band timer with a non-zero value. Reduced band 424 represents a reduction of the guard band on the back-end, such as by having a guard band timer reach a smaller threshold value before performing operation 440. Other ways to decrease guard band 420 will be understood by those skilled in the art.

The testing can include setting a parameter that results in operating the system with reduced guard band 420. The testing can thus have a shorter command latency or lower voltage than what is specified for a memory device and/or memory subsystem. When weak bits are mapped out, the system can operate at runtime with reduced guard band 420.

Figure 5:
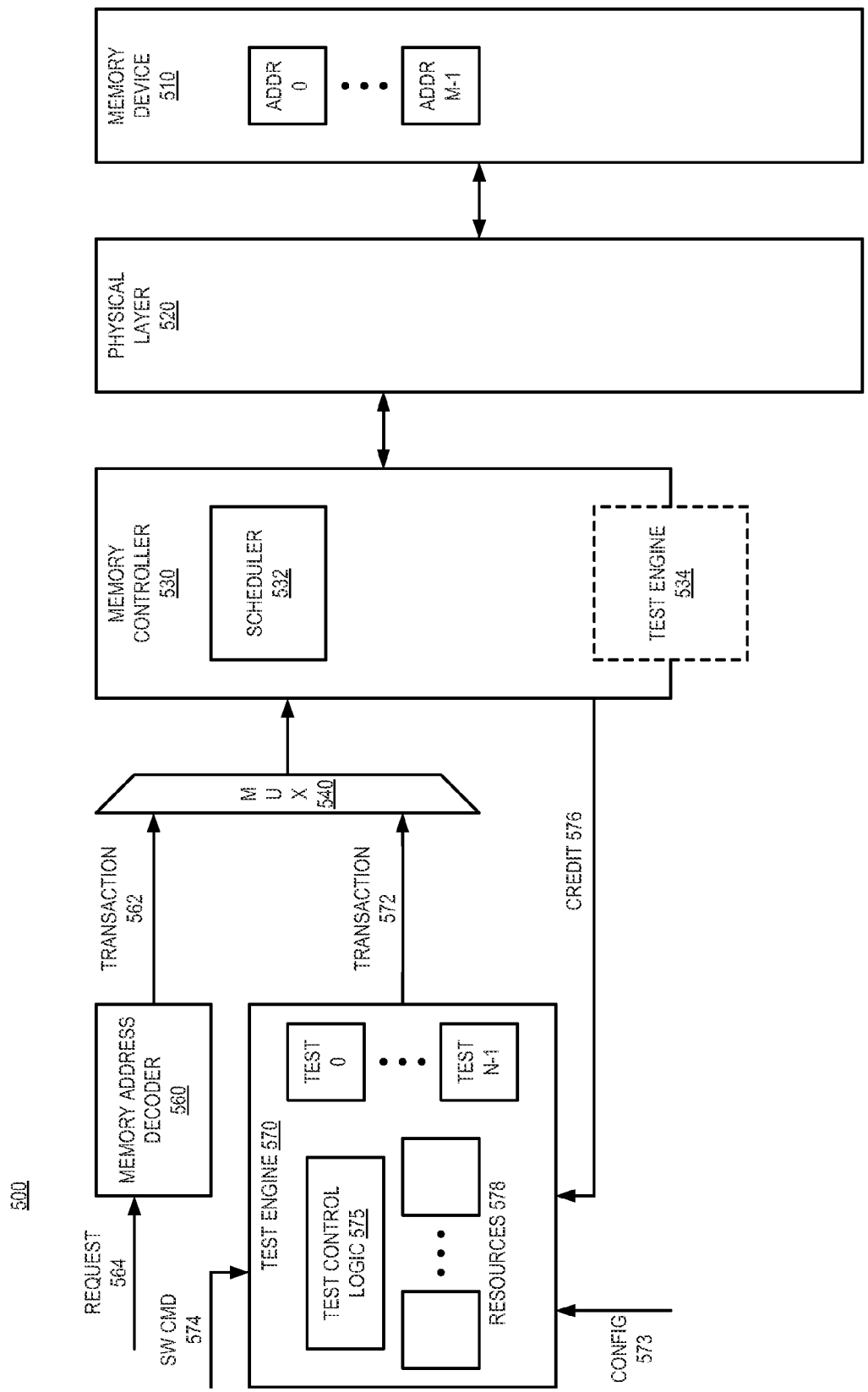
FIG. 5 is a block diagram of an embodiment of a system having a test engine with configurable hardware resources that provides transaction-level, in-system testing.

FIG. 5 is a block diagram of an embodiment of a system having a test engine with configurable hardware resources that provides transaction-level, in-system testing. System 500 is one example of an embodiment of a system with a test engine that provides in-system testing. Memory device 510 stores data and/or instructions for execution by a processor. The operation of memory device 510 is tested by a test engine (e.g., test engine 570 and/or test engine 534). As discussed herein, when a test engine detects a weak bit in memory device 510, system 500 maps out the weak bit.

Physical layer 520 provides the architecture to connect one or more memory devices 510 to memory controller 530. Physical layer 520 can include registers, interconnection lines, physical buses, and other components of a memory device that handle I/O (input/output) to/from memory device 510. In one embodiment, physical layer 520 can include components of a dual inline memory module (DIMM), which can include multiple individual DRAMs.

Memory controller 530 includes scheduler 532 to schedule (e.g., control ordering and timing of commands, implement an access protocol) memory device commands to send to memory device 510 (e.g., via physical layer 520). Memory controller 530 generates memory device commands for memory device 510 to execute. Scheduler 532 schedules the memory device commands generated in response to the memory access transactions received at memory controller 530.

Memory address decoder 560 provides a standard path for memory requests to reach memory controller 530, for example, from a host processor. Memory address decoder 560 receives request 564 from a source such as the host processor. Request 564 generally includes an access command and address information. The address can be a logical address, which does not identify the actual physical address of the memory location(s) to which the memory access is directed. Memory address decoder 560 includes logic that enables it to resolve the physical address from the virtual address information to create transaction 562. In one embodiment, transaction 562 includes a command identifier, and identifies the specific rank, bank row, and column for the command.

System 500 includes test engine 570, which receives software command 574 from a test source (a BIOS device), and generates memory access transactions 572 for scheduling by memory controller 530 and execution by memory device 510. In one embodiment, transactions 572 are of the same form as transactions 562, with a command identifier (e.g., a read identifier or write identifier), and identifier for the specific rank, bank row, and column for the command. In one embodiment, memory controller 530 generates credit 576 as feedback to test engine 570. Memory controller 530 can use credit 576 to provide indicators of the timing of processing transaction 572. Thus, for example, memory controller 530 can indicate when a transaction has been processed.

In one embodiment, test engine 570 uses credit 576 to control the determinism of the testing. For example, test engine 570 can use a single credit policy in that it will only send out one transaction or command at a time. In one embodiment, test engine 570 waits to send out a subsequent transaction until memory controller 530 returns credit 576 indicating the first transaction has been issued. Thus, even if scheduler 532 uses out of order scheduling or just in time scheduling, test engine 570 can send one transaction at a time, which ensures that scheduler 532 will not reorder the test.

In one embodiment, system 500 includes multiplexer 540 or equivalent logic (e.g., logic within memory controller 530) to select between transaction 562 of memory address decoder 560 or transaction 572 of test engine 570. Although the expression "multiplexed" may be used, it will be understood that if the operation of memory address decoder is temporarily suspended, and/or higher-level operations at the processor level are suspended to prevent issuing of memory access requests, transaction 572 can be the only input available during testing. Thus, in one embodiment, mux 540 can be implemented as a simple buffer that can be written by either memory address decoder 560 or test engine 570. Alternatively, mux 540 can be a multiplexer that selects between transaction 562 and transaction 572 responsive to a set signal (not explicitly shown). Such a signal could be generated, for example, by test engine 570 or an external signal controllable by the test source. In one embodiment, such a set signal could be used as a security feature to prevent access to the test engine by malicious code that could be trying to access protected memory contents through the test engine, which it would otherwise not have access to. Thus, selecting the multiplexer can be understood in one embodiment as providing security to the test engine.

In one embodiment, test engine 570 includes dynamically configurable hardware resources 578. For example, in one embodiment, test engine 570 includes one or more configurable/programmable logic arrays or configurable logic devices controlled by test control logic 575. It will be understood that configurable/programmable logic devices can be configured via software control. As mentioned above, the software control can be through a local device, or via a remote administration device. Thus, in one embodiment, configuration (config) 573 is provided by the test source that generates software command 574. In one embodiment, configuration 573 represents a setting of one or more registers or configuration controls in test engine 570, and software logic to program test engine resources 578 can come from a storage device (not shown).

Resource 578 can be used to implement any of a number of different tests, and the configuration of the resources can be different for the different tests, although some configuration settings may overlap between tests. In one embodiment, resources 578 are arranged to implement different FSMs (finite state machines) in response to configuration 573.

Memory device 510 has memory elements (e.g., cells) with addresses ADDR0 through ADDR(M−1). The M addresses could be the range of all addresses in memory device 510, or alternatively could be a range less than the whole device over which a test sequence is to be iterated.

Test engine 570 is shown to include test0 through test(N−1). The N tests can represent different iterations through the same test (e.g., the same test transaction with N different addresses), in which case N and M could be considered equal. The N tests can represent N different tests that are each iterated through the M addresses. As illustrated, test engine 570 includes N different configurations of resources 578 to execute the N different tests. Configuration 573 is provided to configure the N different test setups of resources 578. In one embodiment, a single software command 574 operates to cause test engine 570 to generate M transaction 572 to iteratively test ADDR0 through ADDR(M−1). In one embodiment, multiple tests are generated and passed to the memory controller to be executed in parallel.

In one embodiment, the address range M can be decomposed further into {Rank[Ra-1:0], Bank[B-1:0], Row[R-1:0], Column[C-1:0]} starting and stopping addresses for a test, where the rank, bank, row, and column are understood to be of sizes Ra, B, R, and C, respectively. It will be understood that hardware can adjust the Row/Column/Bank range based on exact organization for each rank of memory device 510 (e.g., a 2 Gb DRAM will have a different number of rows than a 4 Gb DRAM). It will be understood that hardware can adjust the Rank range based on the exact system population (e.g., a system could be populated with single rank or quad rank DIMMs). In one embodiment, test engine 570 includes test control logic 575, which represents logic that enables test engine to modify its configuration based on configuration signal 573. Test control logic 575 manages the configuration of resources 578.

Test engine 570 supports use of incrementing and decrementing (negative incrementing) in sequences, by different rates and values, and across different fields or subfields. Different rates and values can apply to different ranks, rows, columns, or other address settings to generate any pattern types and test sequence. Examples can include diagonal patterns, stripes, checkerboards, programmable-sized hypercubes of a current address, or other patterns.

In one embodiment, test engine 570 is implemented in the same die space, or as an SoC (system on a chip) with the memory controller die. In one embodiment, system 500 includes test engine 534, which can perform similar functions of test engine 570, and is implemented as part of memory controller 530. In one embodiment, test engine 534 allows the testing of other aspects of system 500, such as allowing injection of test data onto the interconnections between memory controller 530 and physical layer 520. In one embodiment, test engine 534 includes a write data buffer (WDB) or other logic buffer on memory controller 530. In one embodiment, test engine 570 and/or test engine 534 is implemented as a hardware finite state machine (FSM). The test engine(s) can be dynamically programmable hardware FSMs.

In one embodiment, memory controller 530 includes one or more counters (not explicitly shown). Examples include, but are not limited by, a refresh counter, a ZQCal (impedance calculation) counter, a power down counter, or other counters. In one embodiment, test engine 570/434 performs a reset of memory controller 530 in conjunction with a memory test. The reset can include resetting one or more counters. The resetting can be performed in response to an event in memory controller 530, such as the execution of a command, or the occurrence of an alert, interrupt, error, or other condition. In one embodiment, the counters can be reset to a programmable reset value specific to a counter and/or specific to a particular test or test event.

Test engine 570 and/or test engine 534 can be used to test data lanes and/or command lanes. It will be understood that a data line or data bus is typically separate from a command/address (C/A) bus on which commands are sent from memory controller 530 to memory device 510. Similar techniques can be used to create stress traffic on the data bus, and/or the C/A bus.

In one embodiment, test engine 534 includes one or more components that enable the test system to record or log errors. The most common error would be a mismatch between data written to the memory device and a read of the written data. The recording of information can include recording address information and write information. The recorded information can include information identifying how many transactions have occurred since the start of the test (before the error occurred), a total number of errors, a number of areas for a memory region, or other information. Such information can indicate which bits in memory device 510 are weak.

FIG. 6A is a block diagram of an embodiment of a test signal generator including a bit array selectable by pattern generators, which can be used to detect weak bits in a memory subsystem. The signal generator provides one example embodiment of a generator in accordance with any embodiment described herein. In one embodiment, the generator can be or be used with any WDB or comparable structure described herein. The generator includes a bit array of M×N bits, where M=8 in the drawing. In one embodiment, the bit array includes 32 cachelines, which assuming a burst length of 8, would mean M=8*32=256. Other values of M are possible. N is a width that provides a desired amount of storage. In one embodiment, N is a width of the data bus. As one example, N=64. Other values of N are possible. In general, it will be understood that there are numerous ways to generate write data for a memory device. The significant part is not necessarily the amount of storage space, which can be designed and/or configured based on implementation, but rather the fact that there is storage space that can be used to generate data patterns.

As illustrated, the bit array has rows representing cycle 610, or cycles of bit generation, and columns representing data lanes 620. As discussed previously, the lanes could be wider than a single bit. It will be understood that to select which cycle 610 to use, mux 630 should be triggered with a number Y of select lines where 2^Y is greater than or equal to M. Thus, three PatternSelGen blocks are shown, PatternSelGen0, PatternSelGen1, and PatternSelGen2. It will be understood that the three different PatternSelGen blocks represent different pattern selection logic. In one embodiment, the different pattern selection logic is used to produce combinations of different types of pattern logic, which produces different combinations of bits in the array. The different logic type is explained in more detail below with respect to FIG. 6B. The selection logic, PatternSelGen produces SEL[2:0] to control mux 630. Mux 630 is one embodiment of a parallel to serial mux (PISO). It will be understood that there can be other, separate PISO paths in a practical system, such as one on a command bus.

As seen, the bit array includes a simple binary sequence for columns 0-2, starting with 000 in row0, and ending with 111 in row7. Other bit array values are possible. There could also be any number of bits sequence patterns in the other columns of the bit array. The bit array structure could be used with no changes to the bits in the rows to provide M fully programmable data patterns. For example, the programmability capability could be used by training algorithms to generate fixed patterns (e.g., MPR 1010 pattern for DDR3 DIMM). In one embodiment, the bit array is used by search algorithms to attempt to find the worst case pattern by adjusting individual bits.

By adding PatternSelGen logic to Sel[2:0], the signal generation logic can operate as a lookup or truth table the encodes a specific Boolean combination of the Sel[2:0] inputs. For example, as shown in the binary sequence of columns 0-2, DQ [0] data is programmed to be 1 whenever Sel[0] is 1. Thus, DQ [0] is programmed to always output Sel[0]. Similarly, DQ[1]=Sel[1], and DQ[2]=(Sel[0]&Sel[2]). In general, such a lookup table approach allows any columns/lanes to be programmed to generate any Boolean combination of {Sel [0],Sel[1],Sel[2]}. Thus, a single PatternSelGen block can be shared by all the columns/lanes and be assigned to any given column/lane with almost no overhead logic.

FIG. 6B is a block diagram of an embodiment of programmable pattern selection generator that can be used to detect weak bits in a memory subsystem. PatternSelGen 640 is one example embodiment of PatterSelGen logic such as used in FIG. 6A. In one embodiment, each PatternSelGen block (e.g., 0, 1, 2) is implemented as PatternSelGen 640, with multiple different logic options for each one. In an alternative embodiment, PatternSelGen 640 is implemented in a more collective fashion rather than having all logic types repeated for each PatternSelGen. For example, PatternSelGen0, PatternSelGen1, and PatternSelGen2 could be three separate muxes 650, which each have a programmable select signal 652, and all three (or other number) multiplexers are connected to the same logic blocks. In another alternative embodiment, the output of mux 650 could be fed into multiple different logic buffers, and multiple different iterations of pattern selection can be made to generate the select signal (e.g., SEL[2:0]).

PatternSelGen 640 can have multiple different pattern options built into it, depending on the implementation of the test system. Three possible examples are illustrated: LSFR (linear shift feedback register) 662, square wave generator 664, and pattern buffer 666. Other types are possible, including types that use remapping or hashing of the address (e.g., row, column, rank, bank, output chunk count) to create patterns such as row stripes, column stripes, or checkerboards, and/or others.

LSFR 662 can generate a pseudorandom pattern with minimal hardware cost. LFSR 662 can use either a fixed or programmable polynomial, depending on implementation. In one embodiment, LFSR 662 has a fixed starting seed, and in another embodiment, LFSR 662 has a programmable starting seed. The programmable aspects can be programmed by the memory controller, or by a test system administrator system. In one embodiment, LSFR 662 is implemented on the same hardware as pattern buffer 666.

Square wave generator 664 can be a FSM (finite state machine) that will generate a digital square wave (e.g., X ones followed by Y zeros) with programmable frequency, phase shift, and duty cycle. The programmable aspects can be programmed by the memory controller, or by a test system administrator system. Given that square wave generator 664 can generate a single tone frequency, can be useful at exciting resonance frequencies in the I/O system of the memory subsystem. In one embodiment, a specific resonance frequency is not known precisely. In such a case, square wave generator 664 can be programmed to increment through a range of frequencies (e.g., $f_{START}$ to $f_{STOP}$) and generate a chirp pattern. The chirp can generate a given frequency for a programmable length of time before incrementing to the next value, where the increment could be done in either a linear or exponential fashion. In one embodiment, the test system uses a square wave generator with chirp as a source of traffic.

In one embodiment, pattern buffer 666 can be a rotating shift register programmed with a fixed X-bit long pattern. Thus, the logic buffer can apply a fixed pattern to some lanes without the overhead of needing to program the entire logic buffer. In a simple case, a programmable shift register can be programmed to walk linearly through test values.

Figure 7:
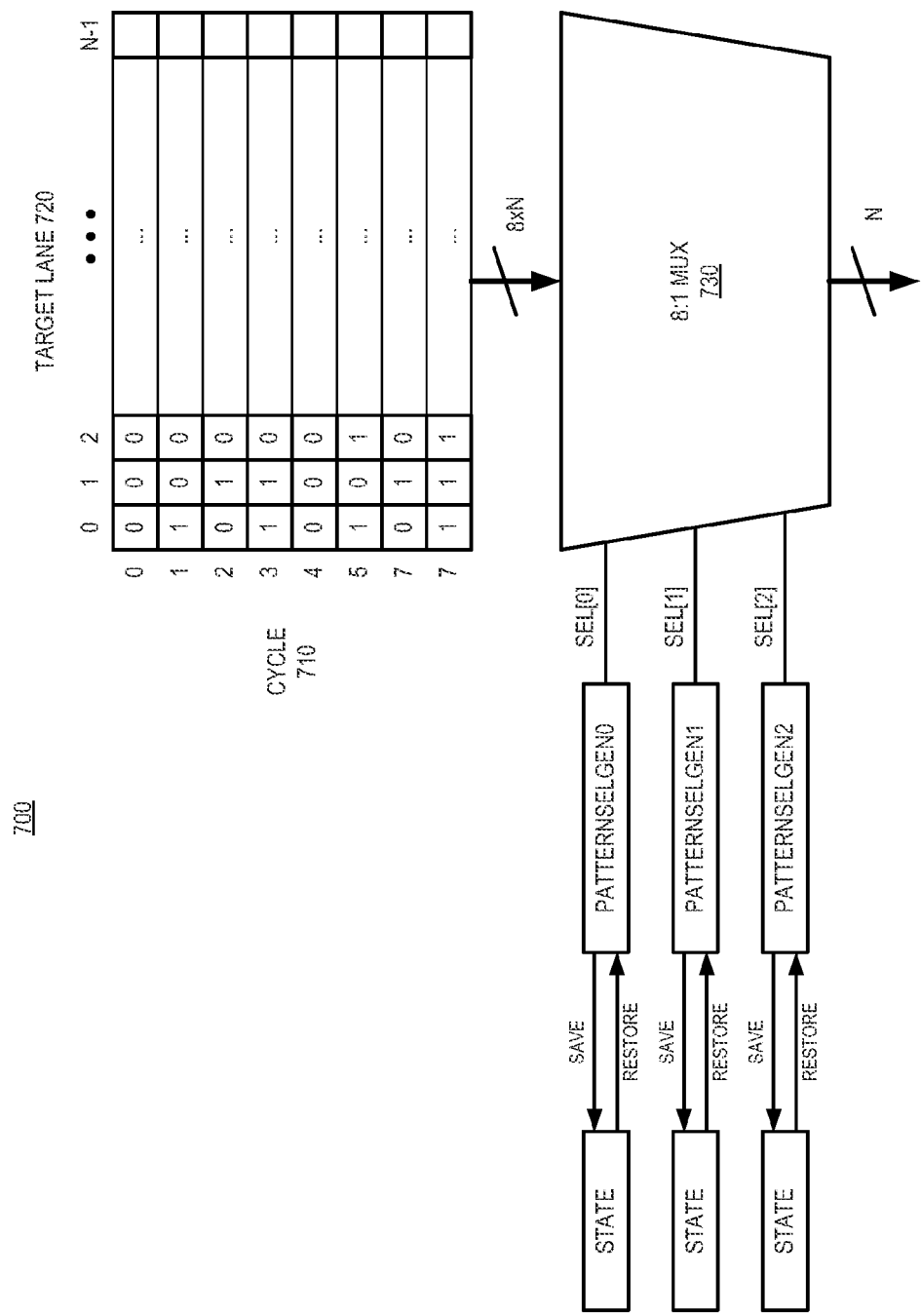
FIG. 7 is a block diagram of an embodiment of a test signal generator including a bit array selectable by pattern generators, where the pattern generators save and restore state.

FIG. 7 is a block diagram of an embodiment of a test signal generator including a bit array selectable by pattern generators, where the pattern generators save and restore state. Logic 700 is one example of a signal generator or signal generator logic in accordance with any embodiment described herein. Similar to what is shown in FIGS. 6A and 6B, logic 700 includes a bit array with rows, cycle 710, and with columns, target lane 720 (which could be either data lanes for data bus stress tests, or command lanes for command bus stress tests). Thus, as illustrated logic 700 includes 8 rows and N columns, but there could be any number of rows needed to implement whatever testing is designed. 8:1 mux 730 (which could alternatively be labeled as an M:1 mux), selects one of the cycles or logical combinations of cycles 710 and outputs it, making an N-bit output to inject onto a data bus as write data.

Many classes of interesting patterns define a victim bit and a group of aggressor bits. As one possible example, suppose a test had eight data lanes, and used LFSR0 for Target[0] (victim) and LFSR1 for Target[7:1] (aggressors). Such a test could be iterated eight times, allowing each lane a chance to be a victim to achieve complete coverage. Other tests may set the victim lane to a static 1 and the aggressor lanes to 0 to create a walking one pattern. A walking zero or other similar pattern could be created in an analogous manner. As illustrated, logic 700 includes eight cachelines of storage, and each victim-aggressor combination could use a single cacheline. Iteration of the test could be achieved by either starting/stopping the test to reprogram logic 700, or increasing the size of the logic buffer. It will be understood that in general, logic 700 could have a number of entries equal to (Number of Victim Lanes)*(2^Number of Sel). With a large enough bit array, the test could simply define a starting and stopping location within the blocks and how fast it should increment from one block to the next, where one block is (2^Number of Sel), and represents a single complete victim pattern.

In one embodiment, a test seeks to have each lane replay the same pattern sequence multiple times during a test, for example, to achieve uniform coverage of the test. For example, continuing the same example from above, the test could have LFSR0 and LFSR1 start with the same initial seed for each victim lane. In one embodiment, logic 700 periodically saves and restores the PatternSelGen state to be able to replay the same pattern sequence multiple times. PatternSelGen state could include, among other things, LFSR seed value, Pattern Buffer value, and/or Square Wave Generator counter values. Thus, the PatternSelGen could have two copies of its state, both initial and current. The current state is the working copy and can be incremented, for example, during the individual transactions. In one embodiment, the initial copy is only updated by software before the test starts or during a save operation. In one embodiment, restore overrides the current state with the initial state. Likewise, a save operation can override the initial state with the current state.

Referring more specifically to logic 700, the selection logic is expanded and more complex than what is shown above in FIG. 6A. In one embodiment, each select line (SEL[2:0]) is selected from multiple potential patterns, for example, by a multiplexer. A simpler case is illustrated for simplicity in illustration. As illustrated, each block, PatternSelGen0, PatternSelGen1, and PatternSelGen2, can save and restore state to reuse a pattern selection multiple times. A save operation stores a current state of the PatternSelGen block into an associated state storage. A restore operation reads the saved state out of the associated state storage to be applied within the PatternSelGen block. The determination to save and/or restore can be triggered in logic by test control logic, either from a memory controller, a test engine, or a remote administration source.

In one embodiment, a WDB including logic 700 can generate both write data and expected read data. Since writes and read will occur at different times, PatternSelGen blocks should be independent between the read and write operations. Such independence allows the write PatternSelGen block to walk through a fixed sequence of traffic (e.g., LFSR increments, Pattern buffer rotations, or others), and its state is only incremented when there is write data. When a read operation is happening, logic 700 can switch to a separate PatternSelGen block that has the same initial condition as write, and can thus replay the same pattern sequence. Such operation can ensure the expected read data will match the write data as long as the number and order of write/read transactions matches, which can be met by making such a constraint on operation of logic 700, either through configuration or runtime programming. One option is to have separate PatternSelGen blocks for read and write. Alternatively, the PatternSelGen blocks can be shared with independent states for read or write transactions. As another alternative, the save/restore flow could be used to provide independent write versus read storage.

Returning to the example above, in one embodiment, the PatternSelGen logic is configured for a particular test or test sequence to restore state every time the cacheline increments. In one embodiment, when logic 700 wraps back to the starting cacheline, the PatternSelGen block can skip the restore operation and replace it with a save operation. Thus, logic 700 could perform a long test that walks through the cachelines multiple times while still making forward progress through the possible test patterns (e.g., LFSR patterns) while providing identical stress on all victim lanes.

It will be understood that logic 700 may be implemented twice in a test system, once for tests related to data bus traffic stress, and another for tests related to command bus traffic stress. The logic could be implemented in different places within the memory subsystem to implement data stress versus command stress.

Figure 8:
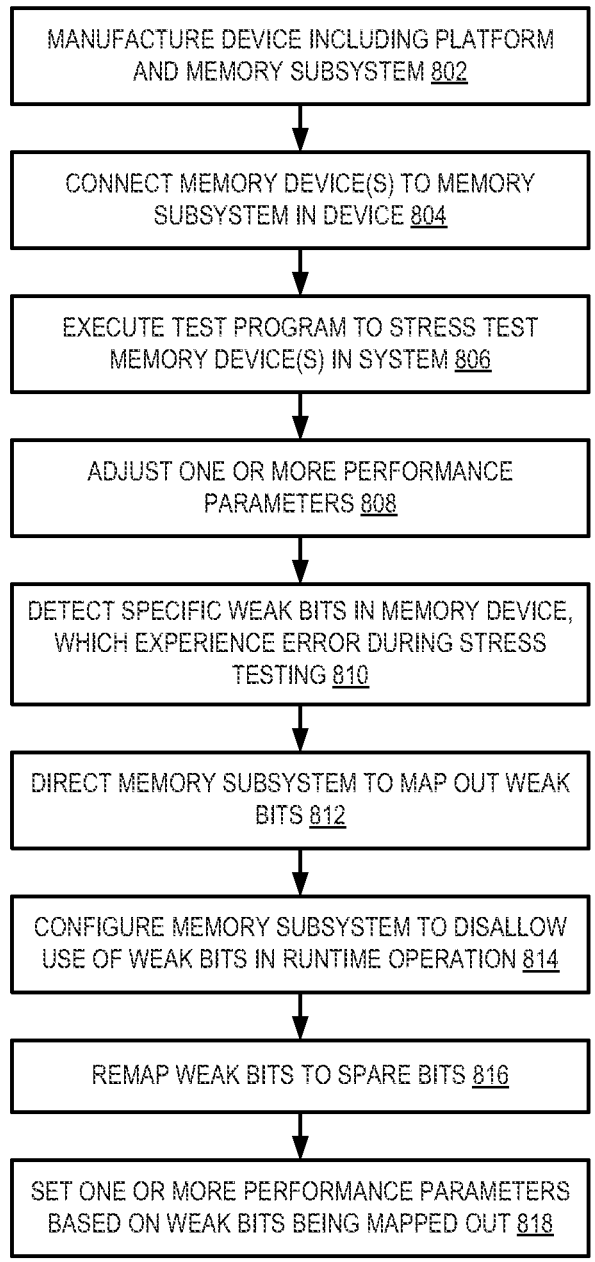
FIG. 8 is a flow diagram of an embodiment of a process for testing operation of memory device at higher performance, and identifying weak bits to map out based on in-system testing.

FIG. 8 is a flow diagram of an embodiment of a process for testing a refresh rate and setting a lower frequency for the refresh rate in accordance with in-system testing. A manufacturer manufactures a device including a host hardware platform and a memory subsystem on the platform, 802. The same or a different entity (either a manufacturer or end user) can then connect one or more memory devices to the memory subsystem in the device, 804. When the device is manufactured and when the device(s) are connected to the memory subsystem, the individual components, such as the memory device(s), have already been tested. At the point of manufacture described herein, the components are presumed to comply with standard or minimum performance expected of the components.

A test engine executes a test program to stress test the memory device(s) in-system, 806. The testing can be performed in accordance with any embodiment described herein. The test engine is embedded on the host platform, and does not require external test equipment to perform the testing. In one embodiment, a BIOS on the platform includes a test program or test routine to perform when memory is connected to the memory subsystem. The test program or routine directs the test engine to perform testing to detect weak bits in the memory device(s). In one embodiment, the test engine is triggered from a location remote to the device including the memory device(s) to test, such as over a network connection.

The memory subsystem, at the control of the test program and/or test engine, can adjust one or more performance parameters of the system to monitor performance in response to the change, 808. In one embodiment, the performance parameter can include settings related to delay between commands or other memory device access operations. In one embodiment, the performance parameter can include settings related to a high voltage reference or voltage supply for a memory device. In one embodiment, the performance parameter can include settings related to temperature. Thus, the test engine can adjust the performance parameter(s), iteratively over a test sequence, and monitor the performance of the memory device(s). The test engine will record errors and can thus detect specific weak bits in the memory device that experience errors when the device(s) operate at the adjusted parameter during the stress testing, 810. The test system can direct the memory subsystem to map out detected weak bits, 812.

In one embodiment, the test engine can modify the voltage or temperature of the system to create a worst case environment. Creating such a worst case environment can be performed using either direct or indirect control, or both. Direct control refers to changing a voltage regulator target or sending a command to a system thermal control such as fan speed control (not shown). Indirect control refers to options such as activating pages, refreshing pages, enable ODT (on die termination), and/or other operations that are known to consume significant power and thus modulate either voltage or temperature. By controlling the frequency of these operations, a rough control over the voltage or temperature of the system is possible.

In one embodiment, the test system can measure the voltage and/or temperature of the system. For example, many systems already include temperature measurement equipment to prevent the system from getting too hot, resulting in degraded user experience (e.g., device uncomfortable to use) or even long term damage. Such temperature information could be used to scale the test results to worst case environmental conditions that cannot easily be created during testing. For example, based on lab characterization, a mathematical equation could be created to describe the required relative refresh rate at different temperatures. By knowing what temperature the test was run at, the refresh results can be extrapolated to other, worst case temperatures.

It is also possible to combine both of these techniques, control and measurement, together to empirically find two or more points on a mathematical curve. Such a calculation could allow a more accurate prediction of the required settings under worst case conditions, reducing any guardband terms that may otherwise be required. In one embodiment, such calculations are used to extrapolate a worst case scenario, or a worst case performance of the memory device in a worst case environmental condition.

The memory subsystem configures itself to disallow use of the weak bits in runtime operation of the device, 814. As mentioned above, the memory subsystem can map out the weak bits and/or disallow use of the weak bits in the host operating system, the memory controller, and/or the memory device itself. In one embodiment, the memory device remaps weak bits to spare bits, 816. When the weak bits are mapped out of use in the memory subsystem, the device can operate at a higher performance than when the bits are in use. In one embodiment, the memory subsystem sets one or more performance parameters based on the weak bits being mapped out, 818. In one embodiment, similar to what is discussed above, a voltage and/or temperature measurement and mathematical equations can be used to decide on the appropriate parameter value. In another embodiment, the system simply maps out the weak bits, and is then expected to operate with a lower failure rate.

Figure 9:
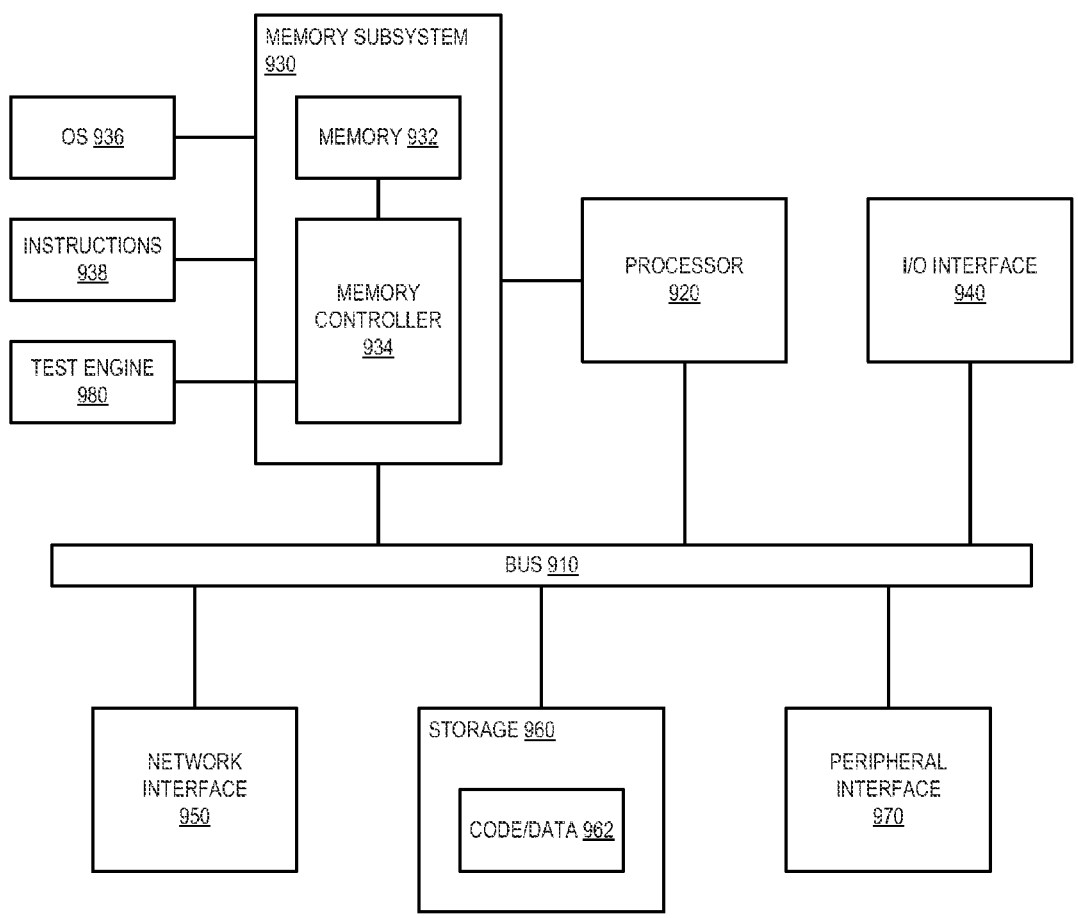
FIG. 9 is a block diagram of an embodiment of a computing system in which in-system testing can be implemented.

FIG. 9 is a block diagram of an embodiment of a computing system in which in-system testing can be implemented. System 900 represents a computing device in accordance with any embodiment described herein, and can be a laptop computer, a desktop computer, a server, a gaming or entertainment control system, a scanner, copier, printer, routing or switching device, or other electronic device. System 900 includes processor 920, which provides processing, operation management, and execution of instructions for system 900. Processor 920 can include any type of microprocessor, central processing unit (CPU), processing core, or other processing hardware to provide processing for system 900. Processor 920 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 930 represents the main memory of system 900, and provides temporary storage for code to be executed by processor 920, or data values to be used in executing a routine. Memory subsystem 930 can include one or more memory devices such as read-only memory (ROM), flash memory, one or more varieties of random access memory (RAM), or other memory devices, or a combination of such devices. Memory subsystem 930 stores and hosts, among other things, operating system (OS) 936 to provide a software platform for execution of instructions in system 900. Additionally, other instructions 938 are stored and executed from memory subsystem 930 to provide the logic and the processing of system 900. OS 936 and instructions 938 are executed by processor 920.

Memory subsystem 930 includes memory device 932 where it stores data, instructions, programs, or other items. In one embodiment, memory subsystem includes memory controller 934, which is a memory controller in accordance with any embodiment described herein, and which includes a scheduler to generate and issue commands to memory device 932.

In one embodiment, system 900 includes test engine 980, which provides memory test transactions to memory controller 934 to have memory controller 934 schedule the transactions to provide deterministic testing. Thus, test engine 980 enables transaction-level memory testing of memory 932 in accordance with any embodiment described herein. The testing can be performed in-system, with the memory devices connected into a hardware platform in which they will be used in runtime. Memory subsystem 930 can map out weak bits detected by the testing, to allow system 900 to operate at a higher performance level.

Processor 920 and memory subsystem 930 are coupled to bus/bus system 910. Bus 910 is an abstraction that represents any one or more separate physical buses, communication lines/interfaces, and/or point-to-point connections, connected by appropriate bridges, adapters, and/or controllers. Therefore, bus 910 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 910 can also correspond to interfaces in network interface 950.

System 900 also includes one or more input/output (I/O) interface(s) 940, network interface 950, one or more internal mass storage device(s) 960, and peripheral interface 970 coupled to bus 910. I/O interface 940 can include one or more interface components through which a user interacts with system 900 (e.g., video, audio, and/or alphanumeric interfacing). Network interface 950 provides system 900 the ability to communicate with remote devices (e.g., servers, other computing devices) over one or more networks. Network interface 950 can include an Ethernet adapter, wireless interconnection components, USB (universal serial bus), or other wired or wireless standards-based or proprietary interfaces.

Storage 960 can be or include any conventional medium for storing large amounts of data in a nonvolatile manner, such as one or more magnetic, solid state, or optical based disks, or a combination. Storage 960 holds code or instructions and data 962 in a persistent state (i.e., the value is retained despite interruption of power to system 900). Storage 960 can be generically considered to be a "memory," although memory 930 is the executing or operating memory to provide instructions to processor 920. Whereas storage 960 is nonvolatile, memory 930 can include volatile memory (i.e., the value or state of the data is indeterminate if power is interrupted to system 900).

Peripheral interface 970 can include any hardware interface not specifically mentioned above. Peripherals refer generally to devices that connect dependently to system 900. A dependent connection is one where system 900 provides the software and/or hardware platform on which operation executes, and with which a user interacts.

Figure 10:
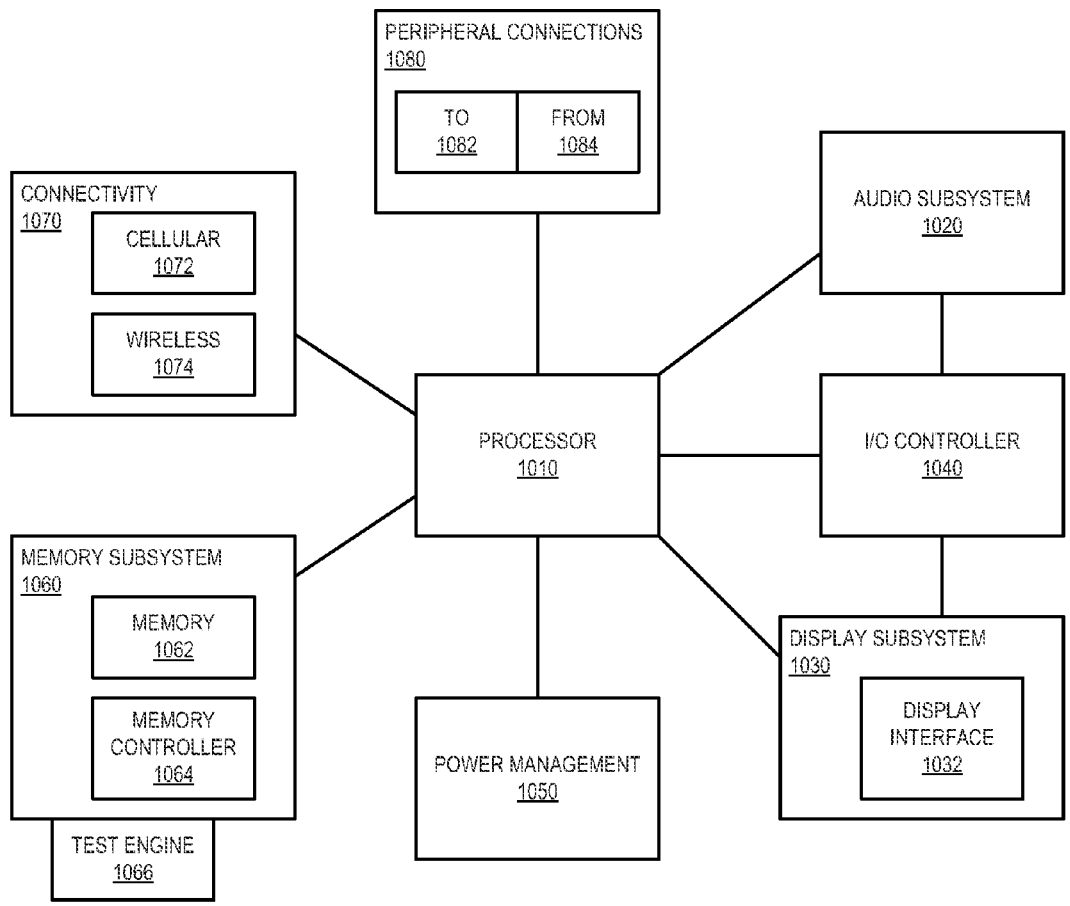
FIG. 10 is a block diagram of an embodiment of a mobile device in which in-system testing can be implemented.

FIG. 10 is a block diagram of an embodiment of a mobile device in which in-system testing can be implemented. Device 1000 represents a mobile computing device, such as a computing tablet, a mobile phone or smartphone, a wireless-enabled e-reader, or other mobile device. It will be understood that certain of the components are shown generally, and not all components of such a device are shown in device 1000.

Device 1000 includes processor 1010, which performs the primary processing operations of device 1000. Processor 1010 can include one or more physical devices, such as microprocessors, application processors, microcontrollers, programmable logic devices, or other processing means. In one embodiment, processor 1010 includes optical interface components in addition to a processor die. Thus, the processor die and photonic components are in the same package. Such a processor package can interface optically with an optical connector in accordance with any embodiment described herein.

The processing operations performed by processor 1010 include the execution of an operating platform or operating system on which applications and/or device functions are executed. The processing operations include operations related to I/O (input/output) with a human user or with other devices, operations related to power management, and/or operations related to connecting device 1000 to another device. The processing operations can also include operations related to audio I/O and/or display I/O.

In one embodiment, device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1000, or connected to device 1000. In one embodiment, a user interacts with device 1000 by providing audio commands that are received and processed by processor 1010.

Display subsystem 1030 represents hardware (e.g., display devices) and software (e.g., drivers) components that provide a visual and/or tactile display for a user to interact with the computing device. Display subsystem 1030 includes display interface 1032, which includes the particular screen or hardware device used to provide a display to a user. In one embodiment, display interface 1032 includes logic separate from processor 1010 to perform at least some processing related to the display. In one embodiment, display subsystem 1030 includes a touchscreen device that provides both output and input to a user.

I/O controller 1040 represents hardware devices and software components related to interaction with a user. I/O controller 1040 can operate to manage hardware that is part of audio subsystem 1020 and/or display subsystem 1030. Additionally, I/O controller 1040 illustrates a connection point for additional devices that connect to device 1000 through which a user might interact with the system. For example, devices that can be attached to device 1000 might include microphone devices, speaker or stereo systems, video systems or other display device, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of device 1000. Additionally, audio output can be provided instead of or in addition to display output. In another example, if display subsystem includes a touchscreen, the display device also acts as an input device, which can be at least partially managed by I/O controller 1040. There can also be additional buttons or switches on device 1000 to provide I/O functions managed by I/O controller 1040.

In one embodiment, I/O controller 1040 manages devices such as accelerometers, cameras, light sensors or other environmental sensors, gyroscopes, global positioning system (GPS), or other hardware that can be included in device 1000. The input can be part of direct user interaction, as well as providing environmental input to the system to influence its operations (such as filtering for noise, adjusting displays for brightness detection, applying a flash for a camera, or other features).

In one embodiment, device 1000 includes power management 1050 that manages battery power usage, charging of the battery, and features related to power saving operation. Memory subsystem 1060 includes memory device(s) 1062 for storing information in device 1000. Memory subsystem 1060 can include nonvolatile (state does not change if power to the memory device is interrupted) and/or volatile (state is indeterminate if power to the memory device is interrupted) memory devices. Memory 1060 can store application data, user data, music, photos, documents, or other data, as well as system data (whether long-term or temporary) related to the execution of the applications and functions of system 1000.

In one embodiment, memory subsystem 1060 includes memory controller 1064 (which could also be considered part of the control of system 1000, and could potentially be considered part of processor 1010). Memory controller 1064 includes a scheduler to generate and issue commands to memory device 1062. In one embodiment, test engine 1066 is coupled to or part of memory subsystem 1060, and provides memory test transactions to memory controller 1064. The test transactions can cause memory controller 1064 to schedule the transactions to provide deterministic testing of memory device 1062. Test engine 1066 enables transaction-level memory testing in memory subsystem 1060 in accordance with any embodiment described herein. The testing can be performed in-system, with the memory devices connected into a hardware platform in which they will be used in runtime. Memory subsystem 1060 can map out weak bits detected by the testing, to allow system 1000 to operate at a higher performance level.

Connectivity 1070 includes hardware devices (e.g., wireless and/or wired connectors and communication hardware) and software components (e.g., drivers, protocol stacks) to enable device 1000 to communicate with external devices. The device could be separate devices, such as other computing devices, wireless access points or base stations, as well as peripherals such as headsets, printers, or other devices.

Connectivity 1070 can include multiple different types of connectivity. To generalize, device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1074 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that device 1000 could both be a peripheral device ("to" 1082) to other computing devices, as well as have peripheral devices ("from" 1084) connected to it. Device 1000 commonly has a "docking" connector to connect to other computing devices for purposes such as managing (e.g., downloading and/or uploading, changing, synchronizing) content on device 1000. Additionally, a docking connector can allow device 1000 to connect to certain peripherals that allow device 1000 to control content output, for example, to audiovisual or other systems.

In addition to a proprietary docking connector or other proprietary connection hardware, device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a method includes receiving a host memory subsystem on a host hardware platform, the host memory subsystem including a memory device; performing a stress test of the memory device in the host memory subsystem with a test component embedded in the host memory subsystem, including testing an operation of the memory device at a performance level higher than a minimum rating guaranteed for the memory device; detecting specific bits that experience failure in response to the stress test; and mapping out the detected specific bits to disallow use of the detected specific bits in runtime operation of the host memory subsystem.

In one embodiment, testing the operation comprises testing operation of the memory device at a lower voltage supply than what is specified for the memory device. In one embodiment, testing the operation comprises testing operation of the memory device at a shorter command latency than what is specified for the memory device. In one embodiment, detecting specific bits comprises identifying an address region of the memory device. In one embodiment, detecting specific bits further comprises performing a stress test on the memory device including controlling environmental conditions of the host memory subsystem. In one embodiment, controlling environmental conditions comprises indirectly controlling the environmental conditions. In one embodiment, wherein controlling environmental conditions comprises controlling one or more of a temperature or an operating voltage.

In one embodiment, detecting specific bits further comprises performing a stress test on the memory device including measuring environmental conditions of the host memory subsystem. In one embodiment, the method further includes extrapolating measured values to determine performance of the memory device in worst case conditions. In one embodiment, mapping out the detected specific bits further comprises marking the detected specific bits invalid. In one embodiment, mapping out the detected specific bits further comprises remapping the detected specific bits to spare bits of the memory device. In one embodiment, mapping out the detected specific bits further comprises remapping the detected specific bits in a memory controller of the memory subsystem. In one embodiment, remapping the detected specific bits comprises remapping the detected specific bits to a reserved region of the memory device. In one embodiment, remapping the detected specific bits comprises remapping the detected specific bits to an alternative memory storage location. In one embodiment, mapping out the detected specific bits further comprises remapping the detected specific bits in a host operating system of the host hardware platform. In one embodiment, mapping out detected specific bits comprises mapping out a number of bits that can be remapped, starting with bits that fail first during the stress test.

In one embodiment, the method further includes setting an operating parameter to a value to operate the memory subsystem at a performance level higher than the minimum rating guaranteed based on mapping out the detected specific bits. In one embodiment, setting the operating parameter comprises programming a voltage level for the operating parameter. In one embodiment, setting the operating parameter comprises setting a value for a latency parameter.

In one aspect, an apparatus includes a host hardware platform including a processor; a memory subsystem on the host hardware platform including a memory device; a test engine embedded in the memory subsystem to perform a stress test of the memory device including testing an operation of the memory device at a performance level higher than a minimum rating guaranteed for the memory device for an operating parameter, detecting specific bits that experience failure in response to the stress test, and map out the detected specific bits to disallow use of the detected specific bits in runtime operation of the host hardware platform.

In one embodiment, the test engine is to test operation of the memory device at a lower voltage supply or a shorter command latency than what is specified for the memory device. In one embodiment, the test engine is to map out the detected specific bits including remapping the detected specific bits to spare bits of the memory device, to a reserved region of the memory device, or to an alternative memory storage location. In one embodiment, the test engine is to map out the detected specific bits including remapping the detected specific bits in a memory controller of the memory subsystem or a host operating system of the host hardware platform. In one embodiment, the test engine is set an operating parameter to a value to operate the memory subsystem at a performance level higher than the minimum rating guaranteed based on mapping out the detected specific bits.

In one aspect, an electronic device includes a host hardware platform including a processor; a memory subsystem on the host hardware platform including a memory device; and a test engine embedded in the memory subsystem to perform a stress test of the memory device including testing an operation of the memory device at a performance level higher than a minimum rating guaranteed for the memory device for an operating parameter, detecting specific bits that experience failure in response to the stress test, and map out the detected specific bits to disallow use of the detected specific bits in runtime operation of the host hardware platform; and a touchscreen display coupled to generate a display based on data stored in the memory subsystem.

In one embodiment, the test engine is to test operation of the memory device at a lower voltage supply or a shorter command latency than what is specified for the memory device. In one embodiment, the test engine is to map out the detected specific bits including remapping the detected specific bits to spare bits of the memory device, to a reserved region of the memory device, or to an alternative memory storage location. In one embodiment, the test engine is to map out the detected specific bits including remapping the detected specific bits in a memory controller of the memory subsystem or a host operating system of the host hardware platform.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A method comprising:
    performing a stress test of a memory device in a memory subsystem with a test component embedded in a host, including testing an operation of the memory device at a performance level higher than a maximum guaranteed performance rating for the memory device, the host including a processor and a memory controller, the memory controller coupled to the memory device, the test component within the memory controller and/or outside the memory controller on a processor side of the memory controller and coupled to an input of the memory controller;
    detecting within the host specific bits that experience failure in response to the stress test; and
    the host configuring the memory device for mapping out the detected specific bits to disallow use of the detected specific bits in runtime operation of the memory subsystem.

2. The method of claim 1, wherein the testing an operation comprises testing an operation of the memory device at a lower voltage supply than what is specified for the memory device.

3. The method of claim 1, wherein the testing an operation comprises testing an operation of the memory device at a shorter command latency than what is specified for the memory device.

4. The method of claim 1, wherein detecting within the host specific bits comprises identifying an address region of the memory device.

5. The method of claim 1, wherein performing a stress test on the memory device includes controlling environmental conditions of the memory subsystem.

6. The method of claim 5, wherein controlling environmental conditions comprises indirectly controlling the environmental conditions.

7. The method of claim 5, wherein controlling environmental conditions comprises controlling one or more of a temperature and an operating voltage.

8. The method of claim 1, wherein performing a stress test on the memory device includes measuring environmental conditions of the host memory subsystem.

9. The method of claim 8, further comprising extrapolating measured values to determine performance of the memory device in worst case conditions.

10. The method of claim 1, wherein mapping out the detected specific bits further comprises:
    marking the detected specific bits invalid.

11. The method of claim 1, wherein mapping out the detected specific bits further comprises:
    remapping the detected specific bits to spare bits of the memory device.

12. The method of claim 1, wherein mapping out the detected specific bits further comprises:
    remapping the detected specific bits in the memory controller.

13. The method of claim 1, further comprising:
    remapping the detected specific bits to a reserved region of the memory device.

14. The method of claim 1, further comprising:
    remapping the detected specific bits to an alternative memory storage location.

15. The method of claim 1, wherein the mapping out the detected specific bits comprises:
    mapping out a number of bits that can be remapped, starting with bits that fail first during the stress test.

16. The method of claim 1, further comprising:
    setting an operating parameter to a value to operate the memory subsystem at a performance level higher than the maximum guaranteed performance rating based on mapping out the detected specific bits.

17. The method of claim 16, wherein setting the operating parameter comprises programming a voltage level for the operating parameter.

18. The method of claim 16, wherein setting the operating parameter comprises setting a value for a latency parameter.

19. An apparatus comprising:
    a host side hardware platform including a processor and a memory controller;
    a memory subsystem including a memory device coupled to the memory controller;
    a test engine embedded in the host side hardware platform within the memory controller and/or outside the memory controller on the processor side of the memory controller and coupled to an input of the memory controller, the test engine to perform a stress test of the memory device that includes a test of an operation of the memory device at a performance level higher than a maximum guaranteed performance rating for the memory device, the host side hardware platform to detect specific bits that experience failure in response to the stress test, and configure the memory device to map out the detected specific bits to disallow use of the detected specific bits in runtime operation of the host side hardware platform.

20. The apparatus of claim 19, wherein the test engine is to test an operation of the memory device at any of:
    a lower voltage supply that what is specified for the memory device;
    a shorter command latency than what is specified for the memory device.

21. The apparatus of claim 19, wherein the memory device is to be configured to map out the detected specific bits to spare bits of the memory device, to a reserved region of the memory device, or to an alternative memory storage location.

22. The apparatus of claim 19, wherein the test is based on mapping out the detected specific bits.

23. The apparatus of claim 19, wherein the test is based on mapping out the detected specific bits.

24. An electronic device comprising:
a host hardware platform including a processor and a memory controller;
a memory subsystem including a memory device;
the host hardware platform including a test engine embedded in the memory controller and/or outside the memory controller on the processor side of the memory controller and coupled to an input of the memory controller, the test engine to perform a stress test of the memory device including testing an operation of the memory device at a performance level higher than a maximum guaranteed performance rating for the memory device, the host hardware platform to detect specific bits that experience failure in response to the stress test, the host hardware platform engine to configure the memory device to map out the detected specific bits to disallow use of the detected specific bits in runtime operation of the host hardware platform; and
a touchscreen display coupled to generate a display based on data stored in the memory subsystem.

25. The electronic device of claim 24, wherein the test engine is to test an operation of the memory device at any of:
a lower voltage supply that what is specified for the memory device;
a shorter command latency than what is specified for the memory device.

26. The electronic device of claim 24, wherein the memory device is to be configured to remap the detected specific bits to spare bits of the memory device, to a reserved region of the memory device, or to an alternative memory storage location.

27. An apparatus comprising:
a host side hardware platform including a processor and a memory controller, the memory controller to couple to a memory subsystem that includes a memory device;
a test engine embedded in the host side hardware platform within the memory controller and/or outside the memory controller on the processor side of the memory controller and coupled to an input of the memory controller, the test engine to perform a stress test of the memory device that includes a test of an operation of the memory device at a performance level higher than a maximum guaranteed performance rating for the memory device, the host side hardware platform to detect specific bits that experience failure in response to the stress test, and configure the memory device to map out the detected specific bits to disallow use of the detected specific bits in runtime operation of the host side hardware platform.

28. The apparatus of claim 27, wherein the test engine is to test an operation of the memory device at any of:
a lower voltage supply that what is specified for the memory device;
a shorter command latency than what is specified for the memory device.

29. The apparatus of claim 27, wherein the memory device is to be configured to remap the detected specific bits to spare bits of the memory device, to a reserved region of the memory device, or to an alternative memory storage location.

* * * * *